United States Patent
Horiguchi et al.

(10) Patent No.: US 8,333,632 B2
(45) Date of Patent: Dec. 18, 2012

(54) LAMP AND METHOD OF MANUFACTURING SAME

(75) Inventors: Takashi Horiguchi, Tokyo (JP); Junichi Yamada, Tokyo (JP); Sakpanom Srisawas, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 13/190,141

(22) Filed: Jul. 25, 2011

(65) Prior Publication Data

US 2011/0281490 A1   Nov. 17, 2011

Related U.S. Application Data

(63) Continuation of application No. 12/339,885, filed on Dec. 19, 2008, now Pat. No. 7,986,078.

(30) Foreign Application Priority Data

Dec. 19, 2007   (JP) ................................ 2007-326773

(51) Int. Cl.
   *H01J 9/00*   (2006.01)
   *H05B 33/10*   (2006.01)

(52) U.S. Cl. .............. 445/26; 445/27; 313/44; 313/498; 313/113

(58) Field of Classification Search ................ 313/44, 313/498–512, 113; 445/26–27
   See application file for complete search history.

(56) References Cited

U.S. PATENT DOCUMENTS

| | | | |
|---|---|---|---|
| 6,652,122 | B2 | 11/2003 | Lin |
| 6,682,211 | B2 | 1/2004 | English et al. |
| 2003/0043590 | A1 | 3/2003 | Walser et al. |
| 2005/0194879 | A1 | 9/2005 | Matsumoto et al. |
| 2009/0073688 | A1 | 3/2009 | Patrick |
| 2010/0097794 | A1 | 4/2010 | Teng et al. |

FOREIGN PATENT DOCUMENTS

JP   2006-134810   5/2006

*Primary Examiner* — Anh Mai
*Assistant Examiner* — Kevin Quarterman
(74) *Attorney, Agent, or Firm* — Kenealy Vaidya LLP

(57) ABSTRACT

A lamp including a plurality of light emitting devices and heat sinks can be configured to dissipate heat generated by the plurality of light emitting devices. The heat sinks can be branched into a generally Y-shaped configuration as viewed in a section that includes a primary optical axis of the vehicle lamp. One of the light emitting devices is connected to one of the branched parts of the heat sinks. Another light emitting device is connected to the other branched part of the heat sinks.

13 Claims, 4 Drawing Sheets

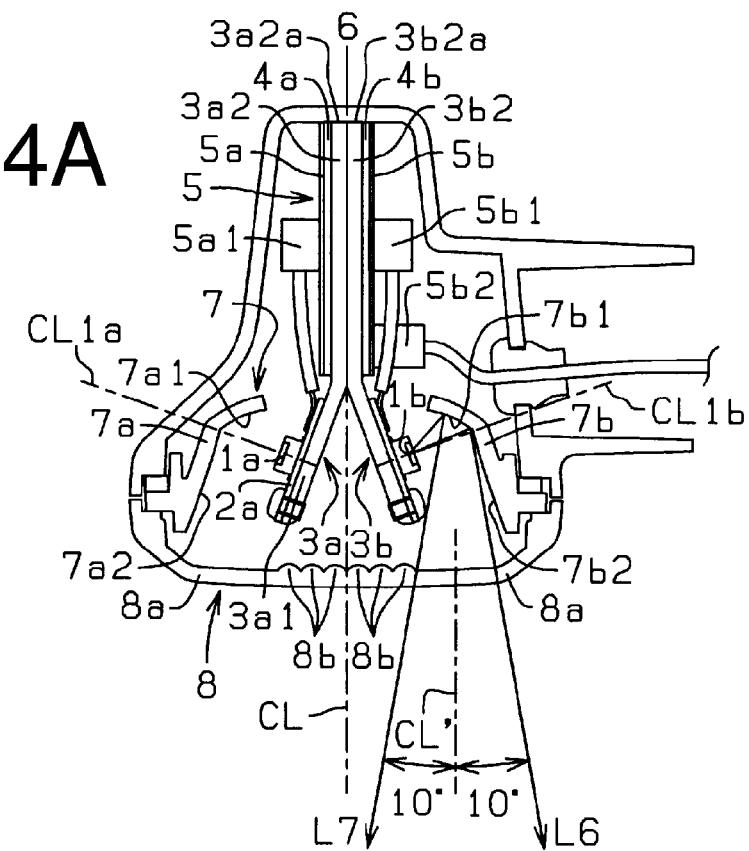
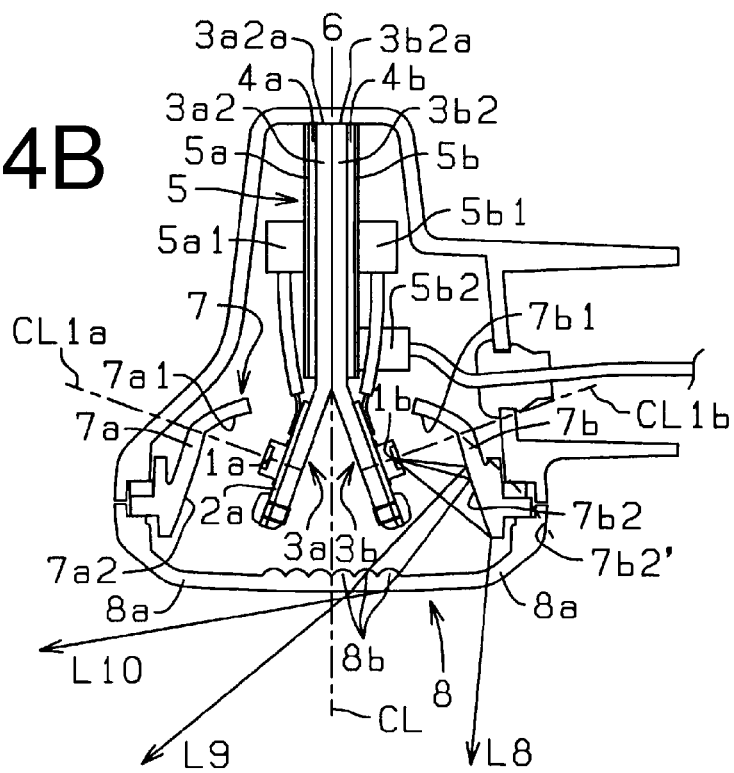

LAMP AND METHOD OF MANUFACTURING SAME

This application is a Continuation application and claims the priority benefit under 35 U.S.C. §120 of U.S. patent application Ser. No. 12/339,885 filed on Dec. 19, 2008 now U.S. Pat. No. 7,986,078, which in turn claims the priority under 35 U.S.C. §119 of Japanese Patent Application No. 2007-326773 filed on Dec. 19, 2007, which are both hereby incorporated in their entireties by reference.

BACKGROUND

1. Technical Field

The presently disclosed subject matter relates to a lamp which has a plurality of light emitting devices and a heat sink configured to dissipate heat generated by the plurality of light emitting devices, and a method for manufacturing the same. In particular, the presently disclosed subject matter relates to a vehicle lamp which can dissipate heat generated by a plurality of light emitting devices by means of a heat sink, and a method for manufacturing the same.

2. Description of the Related Art

Conventionally, there have been known lamps that have a plurality of light emitting devices and a heat sink configured to dissipate heat generated by the plurality of light emitting devices. Among the examples of vehicle lamps of this type, one of interest is shown in FIG. 1 of Japanese Patent Application Laid-Open No. 2006-134810 (hereinafter, referred to as a conventional vehicle lamp).

The conventional vehicle lamp has a plurality of light emitting devices (for example, a main LED and a sub LED), and a heat sink (being a radiator plate) configured to dissipate heat generated by these devices. More specifically, a first light emitting device (the main LED) is fixed to the top of the heat sink (the radiator plate), and a second light emitting device is fixed to the bottom of the heat sink. That is, the heat sink is shared between the first light emitting device and the second light emitting device.

The heat sink of the conventional vehicle lamp is formed in a generally I-shaped configuration when seen in a vertical section that includes the primary optical axis of the vehicle lamp. As mentioned above, the first light emitting device is fixed to the top of the heat sink, and the second light emitting device is fixed to the bottom of the heat sink.

In the conventional vehicle lamp, the heat sink therefore has a relatively small surface area per single light emitting device (the main LED or the sub LED). This makes it difficult or sometimes impossible for the conventional vehicle lamp to sufficiently dissipate the heat generated by the plurality of light emitting devices (the main LED and the sub LED) through the heat sink.

SUMMARY

The presently disclosed subject matter was devised in view of these and other features, problems, characteristics, and in association with the conventional art. According to an aspect of the presently disclosed subject matter, a lamp can be provided which is configured to sufficiently dissipate heat generated by a plurality of light emitting devices by means of a heat sink.

According to another aspect of the presently disclosed subject matter, a lamp can include: a plurality of light emitting devices including at least first and second light emitting devices; and a first heat sink configured to dissipate heat generated by the plurality of light emitting devices, the first heat sink having a first branched part and a second branched part in a generally Y-shaped configuration in a cross-section including a primary optical axis of the lamp, the first branched part being connected with at least the first light emitting device, the second branched part being connected with at least the second light emitting device.

According to still another aspect of the presently disclosed subject matter, the above lamp can further include: a first reflector configured to reflect light emitted from the first light emitting device toward the front with respect to the primary optical axis of the lamp, the first reflector having a first reflecting surface configured to reflect a beam of light that is emitted from the first light emitting device behind a primary optical axis of the first light emitting device with respect to the primary optical axis of the lamp, and a second reflecting surface configured to reflect a beam of light that is emitted from the first light emitting device in a frontward direction of the primary optical axis of the first light emitting device with respect to the primary optical axis of the lamp; and a second reflector configured to reflect light emitted from the second light emitting device toward the front with respect to the primary optical axis of the lamp, the second reflector having a third reflecting surface configured to reflect a beam of light that is emitted from the second light emitting device behind a primary optical axis of the second light emitting device with respect to the primary optical axis of the lamp, and a fourth reflecting surface configured to reflect a beam of light that is emitted from the second light emitting device in a frontward direction of the primary optical axis of the second light emitting device with respect to the primary optical axis of the lamp. In this lamp, the light beam reflected from the first reflecting surface and the light beam reflected from the third reflecting surface can be projected forward with respect to the primary optical axis of the lamp at relatively small angles to the primary optical axis of the lamp, and the light beam reflected from the second reflecting surface and the light beam reflected from the fourth reflecting surface can be projected forward with respect to the primary optical axis of the lamp at relatively large angles to the primary optical axis of the lamp.

According to still another aspect of the presently disclosed subject matter, the above lamp can further include an outer lens. In this lamp, the light beam reflected from the second reflecting surface and the light beam reflected from the fourth reflecting surface can cross each other near the primary optical axis of the lamp, and the outer lens can have a lens cut area near the position where the light beam that is reflected from the second reflecting surface and the light beam that is reflected from the fourth reflecting surface cross each other.

According to still another aspect of the presently disclosed subject matter, the above lamp can be configured such that the lens cut area can be arranged in front of the first and second branched parts of the first heat sink, and outlines of the first and second branched parts and an outline of the lens cut area can be generally consistent with each other when seen from the front with respect to the primary optical axis of the lamp.

According to still another aspect of the presently disclosed subject matter, the above lamp can be configured such that a circuit substrate configured to supply power to the plurality of light emitting devices can be connected with first and second sides of an unbranched part of the first heat sink, an end of the unbranched part opposite from the first and second branched parts can be thermally connected with a housing of the lamp, and a border area between the first and second branched parts and the unbranched part can be thermally connected with the housing of the lamp.

According to still another aspect of the presently disclosed subject matter, the above lamp can be configured such that the circuit substrate configured to supply power to the plurality of light emitting devices can be made of a flexible substrate, a half of the flexible substrate can be connected with the first side of the unbranched part of the first heat sink, and the other half of the flexible substrate can be connected with the second side of the unbranched part of the first heat sink.

According to still another aspect of the presently disclosed subject matter, the above lamp can be manufactured by a method including: joining a second heat sink to a half of the flexible substrate in advance before the half of the flexible substrate is connected with the first side of the unbranched part of the first heat sink; joining a third heat sink to the other half of the flexible substrate in advance before the other half of the flexible substrate is connected with the second side of the unbranched part of the first heat sink; joining the second heat sink to the first side of the unbranched part of the first heat sink, thereby connecting the half of the flexible substrate with the first side of the unbranched part of the first heat sink; and joining the third heat sink to the second side of the unbranched part of the first heat sink, thereby connecting the other half of the flexible substrate with the second side of the unbranched part of the first heat sink.

According to still another aspect of the presently disclosed subject matter, the above lamp can be used as a vehicle lamp including a headlamp, turn signal lamp, position lamp, daytime running lamp, high beam lamp, fog lamp, tail lamp, stop lamp, traffic lamp, and the like. Of course, the lamp could also be used as a general purpose lamp, possibly for housing applications.

A vehicle lamp according to one of the aspects of the presently disclosed subject matter can have a plurality of light emitting devices including at least first and second light emitting devices, and a first heat sink configured to dissipate heat generated by the plurality of light emitting devices. In addition, the first heat sink can include a first branched part and second branched part in a generally Y-shaped configuration in a section including the primary optical axis of the vehicle lamp. The first branched part can be connected with at least the first light emitting device, and the second branched part can be connected with at least the second light emitting device.

Consequently, the heat generated by the first light emitting device can be dissipated by the first branched part of the first heat sink, not only from the side where the light emitting device is connected but also from the side where it is not connected.

The heat generated by the second light emitting device can be dissipated by the second branched part of the first heat sink, not only from the side where the light emitting device is connected but also from the side where it is not connected.

According to the vehicle lamp of the above aspect, it is therefore possible to improve the efficiency of heat dissipation with respect to the heat generated by the plurality of light emitting devices when compared with the conventional vehicle lamp (shown in FIG. 1 of Japanese Patent Application Laid-Open No. 2006-134810) where the heat sink is formed in a generally I-shaped configuration when seen in the vertical plane including the primary optical axis of the vehicle lamp. That is, the heat generated by the plurality of light emitting devices can be sufficiently dissipated by the first heat sink.

The vehicle lamp of the foregoing configuration can prevent a shortened life, dropped luminous intensity, and discolored light of the light emitting devices, which might result from insufficient dissipation of the heat generated by the plurality of light emitting devices.

In the vehicle lamp of the foregoing configuration, the first heat sink can be branched into the generally Y-shaped configuration in a horizontal section that includes the primary optical axis of the vehicle lamp. The presently disclosed subject matter is not limited thereto, however. Instead, the first heat sink may be branched so as to have a generally Y-shaped configuration in a vertical section that includes the primary optical axis of the vehicle lamp, or in an arbitrary cross section including the primary optical axis of the vehicle lamp other than the horizontal section or the vertical section.

In the vehicle lamp of the foregoing configuration, the first heat sink having the generally Y-shaped section can be formed by joining two generally L-shaped members. The presently disclosed subject matter is not limited thereto, however. Instead, the first heat sink of generally Y-shape configuration may be made of a single member that is so formed by molding, such as aluminum die-casting.

A vehicle lamp according to another aspect of the presently disclosed subject matter can have the first reflector configured to reflect the light emitted from the first light emitting device toward the front with respect to the primary optical axis of the vehicle lamp, and the second reflector configured to reflect the light emitted from the second light emitting device toward the front with respect to the primary optical axis of the vehicle lamp. The first (or second) reflector can have the first reflecting surface (or third reflecting surface) configured to reflect the beam of light that is emitted from the light emitting device behind the primary optical axis of the light emitting device with respect to the direction of the vehicle lamp. The first reflector (or second reflector) can also have the second reflecting surface (or fourth reflecting surface) configured to reflect the beam of light that is emitted from the light emitting device in a frontward direction of the primary optical axis of the light emitting device with respect to the direction of the vehicle lamp.

In the vehicle lamp of the foregoing configuration, the light beam reflected from the first reflecting surface and the light beam reflected from the third reflecting surface can be projected forward with respect to the primary optical axis of the vehicle lamp at relatively small angles to the primary optical axis of the vehicle lamp. The light beam reflected from the second reflecting surface and the light beam reflected from the fourth reflecting surface can be projected forward with respect to the primary optical axis of the vehicle lamp at relatively large angles to the primary optical axis of the vehicle lamp.

In other words, the beam of light that is emitted from the first light emitting device in a frontward direction of the primary optical axis of this light emitting device with respect to the direction of the vehicle lamp is not reflected from the first reflector so as to be projected in front of the vehicle lamp at relatively small angles to the primary optical axis of the vehicle lamp, but can be reflected from the first reflector so as to be projected in front of the vehicle lamp at relatively large angles to the primary optical axis of the vehicle lamp. This allows miniaturization of the first reflector.

Furthermore, in the vehicle lamp of the foregoing configuration, the beam of light that is emitted from the second light emitting device in a frontward direction of the primary optical axis of this light emitting device with respect to the direction of the vehicle lamp is not reflected from the second reflector so as to be projected in front of the vehicle lamp at relatively small angles to the primary optical axis of the vehicle lamp, but can be reflected from the second reflector so as to be projected in front of the vehicle lamp at relatively large angles to the primary optical axis of the vehicle lamp. This allows miniaturization of the second reflector.

In a vehicle lamp according to another aspect of the presently disclosed subject matter, the light beam reflected from the second reflecting surface and the light beam reflected from the fourth reflecting surface can cross each other near the primary optical axis of the vehicle lamp. In addition, the outer lens can have a lens cut area near the position where the light beam reflected from the second reflecting surface and the light beam reflected from the fourth reflecting surface cross each other. It follows that the lens cut area formed on the outer lens of the vehicle lamp can diffuse the light beam reflected from the second reflecting surface. The lens cut area can also diffuse the light beam reflected from the fourth reflecting surface.

This allows the miniaturization of the outer lens of the vehicle lamp, and by extension the miniaturization of the entire vehicle lamp, when compared with the case where lens cut areas for the respective reflecting surfaces are provided separately from the outer lens of the vehicle lamp.

In a vehicle lamp according to another aspect of the presently disclosed subject matter, the lens cut area can be arranged in front of the first and second branched parts of the first heat sink. The outlines of the first and second branched parts and the outline of the lens cut area can be generally consistent with each other when seen from the front of the vehicle lamp. The lens cut area can thus prevent the first and second branched parts of the first heat sink from being visible from the front of the vehicle lamp. In other words, the lens cut area for diffusing the light beam reflected from the second reflecting surface and the light beam reflected from the fourth reflecting surface can be used as means for preventing the first and second branched parts of the first heat sink from being visible from the front of the vehicle lamp.

This can suppress the cost of the entire vehicle lamp when compared with the case where a shielding part is provided aside from the lens cut area.

In a vehicle lamp according to another aspect of the presently disclosed subject matter, the circuit substrate configured to supply power to the plurality of light emitting devices can be connected with both sides of the unbranched part of the first heat sink. The end of the unbranched part opposite from the first and second branched parts can be thermally connected with the housing of the vehicle lamp. The border area between the branched parts and the unbranched part can also be thermally connected with the housing of the vehicle lamp. According to this configuration, some of the heat that is generated by components on the circuit substrate in connection with both sides of the unbranched part of the first heat sink can be transferred to the housing of the vehicle lamp through the end of the unbranched part, and can be dissipated from the housing of the vehicle lamp. Some of the heat generated by the components on the circuit substrate can also be transferred to the housing of the vehicle lamp through the border area between the branched and unbranched parts, and can be dissipated from the housing of the vehicle lamp.

In other words, in the vehicle lamp of the foregoing configuration, the heat generated by the components on the circuit substrate in connection with the unbranched part of the heat sink can be prevented from transfer to the area of the first heat sink where the plurality of light emitting devices are connected. This can suppress a drop in the efficiency of heat dissipation for the plurality of light emitting devices, which might result if the heat generated by the components on the circuit substrate is transferred to the area of the first heat sink where the plurality of light emitting devices are connected.

Put another way, heat dissipation channels can be provided for the heat generated by the components on the circuit substrate so that the heat generated by the components on the circuit substrate configured to supply power to the plurality of light emitting devices can be dissipated without reaching the plurality of light emitting devices. This can improve the efficiency of heat dissipation for the plurality of light emitting devices as compared to the case without sufficient heat dissipation channels.

In a vehicle lamp according to another aspect of the presently disclosed subject matter, the circuit substrate configured to supply power to the plurality of light emitting devices can be made of a flexible substrate. A half of the flexible substrate can be connected with the first side of the unbranched part of the first heat sink. The other half of the flexible substrate can be connected with the second side of the unbranched part of the first heat sink. This can reduce the parts count of the entire vehicle lamp, and by extension the assembly cost of the entire vehicle lamp, when compared with the case where rigid substrates are connected to the respective sides of the first heat sink. More specifically, it is possible to reduce the number of substrates, as well as wiring, couplers, and the like for connecting one rigid substrate to the other rigid substrate. The entire vehicle lamp can thus be reduced in size.

The vehicle lamp of the foregoing configuration allows an improved packing density for the components on the circuit substrate. More specifically, a thin flexible substrate with low thermal resistance can be used to transfer the heat generated by the components on the substrate to the first heat sink quickly. This can reduce the thermal load on the components, so that a plurality of components can be mounted on the substrate with an increased package density.

According to a method of manufacturing a vehicle lamp according to another aspect of the presently disclosed subject matter, the second heat sink can be joined to a half of the flexible substrate in advance before the half of the flexible substrate is connected with the first side of the unbranched part of the first heat sink. The third heat sink can be joined to the other half of the flexible substrate in advance before the other half of the flexible substrate is connected with the second side of the unbranched part of the first heat sink. Then, the second heat sink can be joined to the first side of the unbranched part of the first heat sink, whereby the half of the flexible substrate can be connected with the first side. The third heat sink can be joined to the second side of the unbranched part of the first heat sink, whereby the other half of the flexible substrate can be connected with the second side. This allows improved workability when assembling the flexible substrate and the first heat sink, as compared to the case where the halves of the flexible substrate are directly joined to the respective sides.

BRIEF DESCRIPTION OF THE DRAWINGS

These and other characteristics, features, and advantages of the presently disclosed subject matter will become clear from the following description with reference to the accompanying drawings, wherein:

FIGS. 4A to 4B are diagrams showing light beams projected from the vehicle lamp of FIGS. 1A and 1B.

DETAILED DESCRIPTION OF EMBODIMENTS

A description will now be made below to exemplary embodiments of vehicle lamps of the presently disclosed subject matter with reference to the accompanying drawings.

Figure 1A:
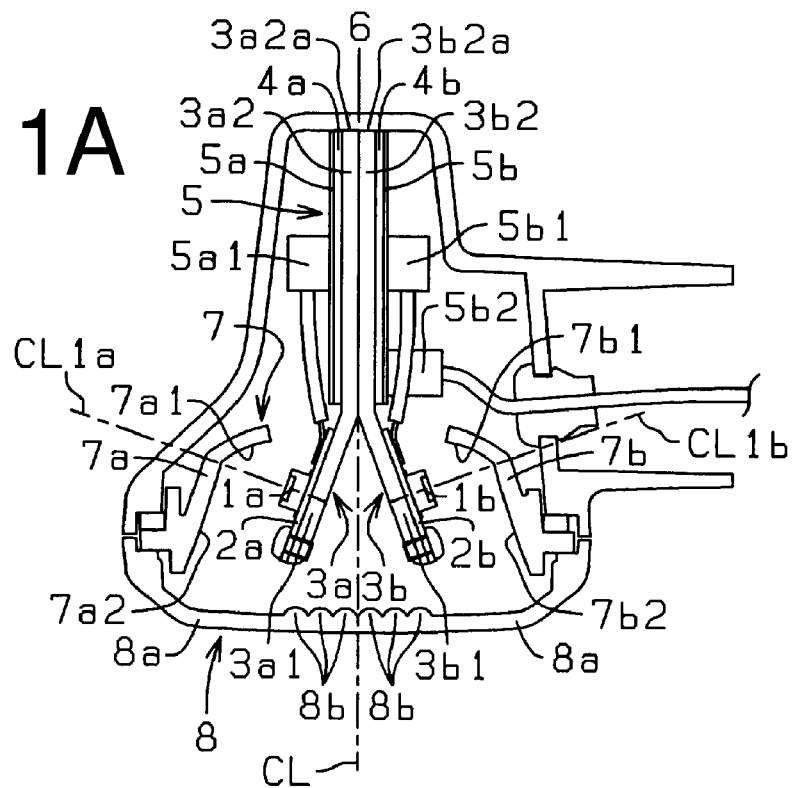
FIGS. 1A and 1B are diagrams showing a vehicle lamp according to a first exemplary embodiment made in accordance with principles of the presently disclosed subject matter.
Figure 1B:
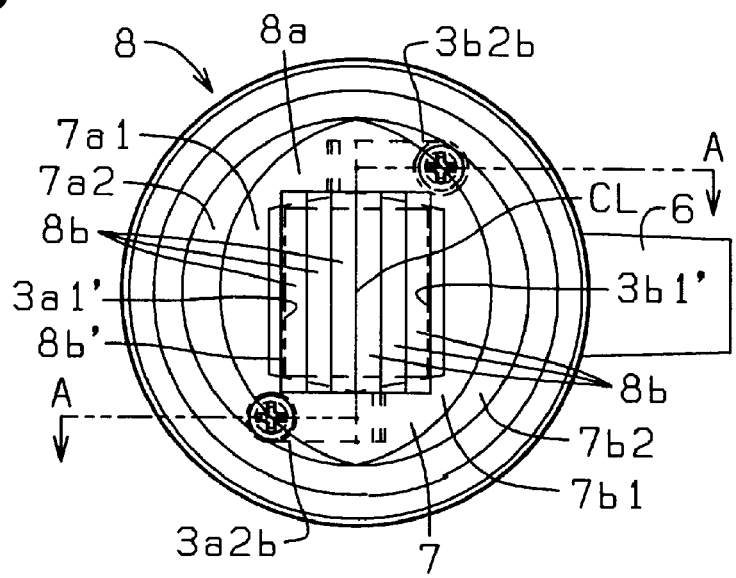
Figure 2A:
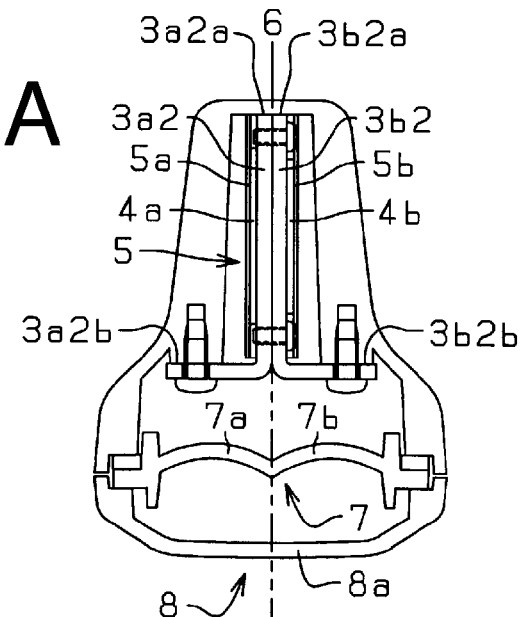
FIGS. 2A to 2C are diagrams showing different views of the vehicle lamp of FIGS. 1A and 1B.
Figure 2B:
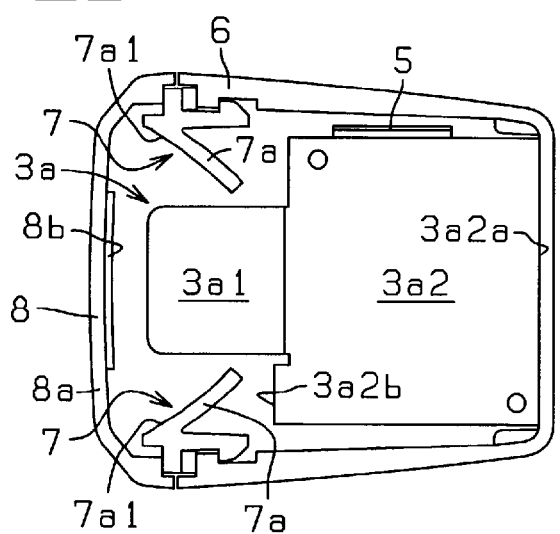
Figure 2C:
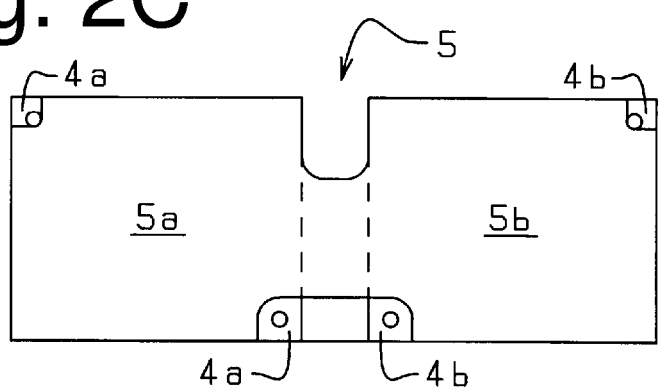

Hereinafter, an embodiment of the vehicle lamp according to the presently disclosed subject matter will be described. FIGS. 1A, 1B, 2A, 2B, and 2C are diagrams showing the vehicle lamp according to the present exemplary embodiment. To be more specific, FIG. 1A is a sectional view of the vehicle lamp according to the present exemplary embodiment, taken along a horizontal plane that includes a primary optical axis CL of the vehicle lamp along which light is emitted from the lamp in an optical axis light emitting direction. FIG. 1B is a front view of the vehicle lamp according to the present exemplary embodiment. FIG. 2A is a sectional view taken along line A-A of FIG. 1B. FIG. 2B is a sectional view of the vehicle lamp according to the present exemplary embodiment, taken along a vertical plane that includes the primary optical axis CL of the vehicle lamp. FIG. 2C is a developed view of an assembly that constitutes a part of the vehicle lamp according to the present exemplary embodiment, the assembly including heat sinks 4a and 4b and a flexible substrate 5.

Figure 3A:
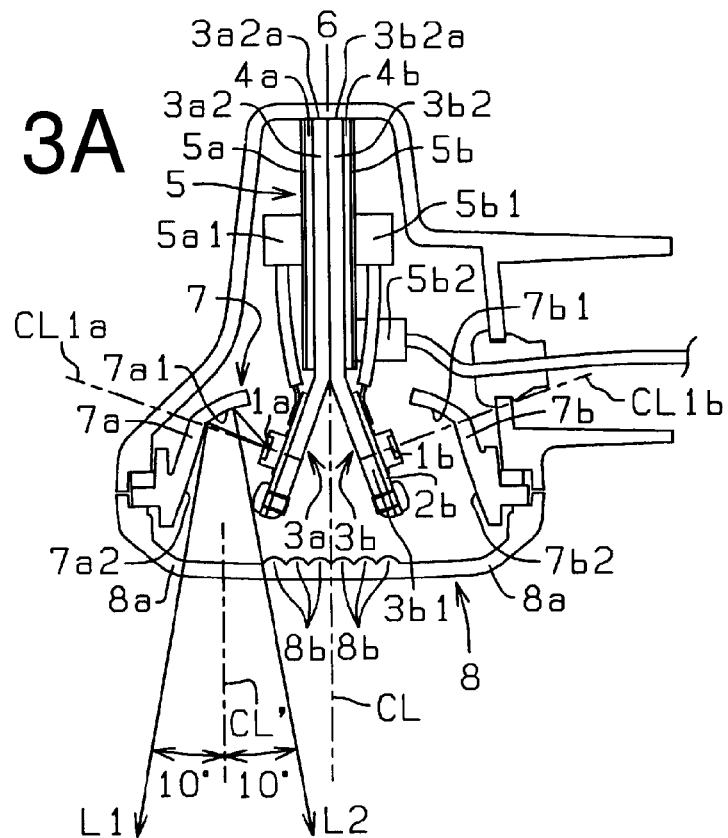
FIGS. 3A and 3B are diagrams showing light beams projected from the vehicle lamp of FIGS. 1A and 1B.
Figure 3B:
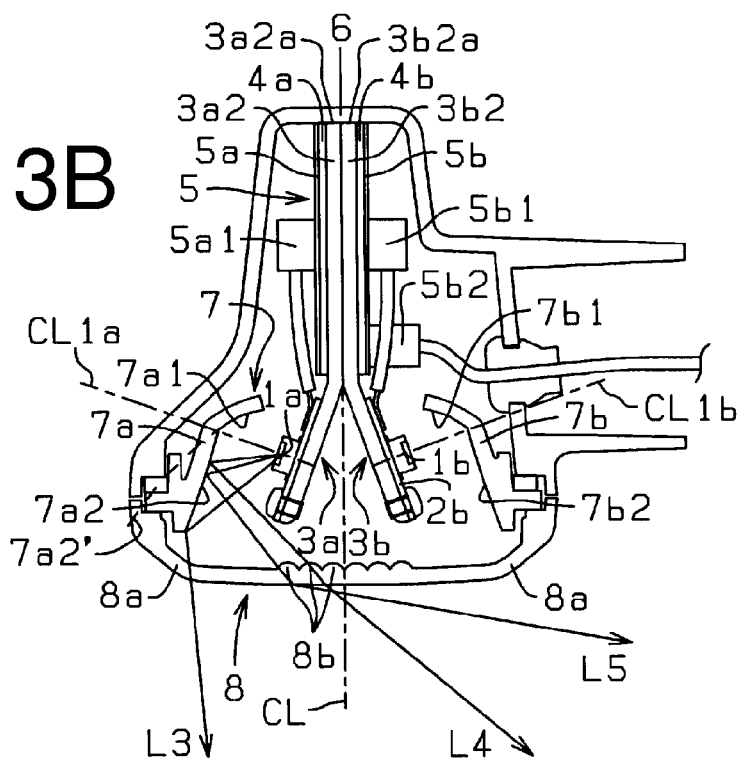

FIGS. 3A, 3B, 4A, and 4B are diagrams showing beams of light emitted from the vehicle lamp of FIGS. 1A and B. More specifically, FIG. 3A is a diagram showing light beams L1 and L2 that are emitted from a light emitting device 1a in a direction rearward (above in the diagram) with respect to a primary optical axis CL1a of the light emitting device 1a. In other words, light beams L1 and L2 have directional vector components in both the direction opposite the optical axis light emitting direction and a direction perpendicular to the optical axis light emitting direction. The light beams L1 and L2 are reflected at a reflecting surface 7a1 of a reflector part 7a of a reflector 7, and projected in the illuminating direction of the vehicle lamp (downward in the diagram). FIG. 3B is a diagram showing light beams L3, L4, and L5 that are emitted from the light emitting device 1a in a forward direction (below, in the diagram) with respect to the primary optical axis CL1a of the light emitting device 1a. In other words, light beams L3, L4, and L5 have directional vector components in both the direction along the optical axis light emitting direction and a direction perpendicular to the optical axis light emitting direction. The light beams L3, L4, and L5 are reflected at a reflecting surface 7a2 of the reflector part 7a of the reflector 7 and projected in the illuminating direction and having a vector component in the optical axis light emitting direction of the vehicle lamp (such the light is directed to the lower right, in the diagram).

FIG. 4A is a diagram showing light beams L6 and L7 that are emitted from a light emitting device 1b in a rearward direction (above, in the diagram) with respect to a primary optical axis CL1b of the light emitting device 1b. In other words, light beams L6 and L7 have directional vector components in both the direction opposite the optical axis light emitting direction and a direction perpendicular to the optical axis light emitting direction. The light beams L6 and L7 are reflected at a reflecting surface 7b1 of a reflector part 7b of the reflector 7, and projected in the illuminating direction of the vehicle lamp (downward, in the diagram). FIG. 4B is a diagram showing light beams L8, L9, and L10 that are emitted from the light emitting device 1b in a forward direction (below, in the diagram) with respect to the primary optical axis CL1b of the light emitting device 1b. In other words, light beams L8, L9, and L10 have directional vector components in both the direction of the optical axis light emitting direction and a direction perpendicular to the optical axis light emitting direction. The light beams L8, L9, and L10 are reflected at a reflecting surface 7b2 of the reflector part 7b of the reflector 7, and projected in the illuminating direction and having a vector component in the optical axis light emitting direction of the vehicle lamp (such that the light is directed to the lower left, in the diagram).

In the vehicle lamp of the present exemplary embodiment, as shown in FIG. 1A, the light emitting device 1a, such as an LED, can be mounted on a base member 2a having a high thermal conductivity. The light emitting device 1b such as an LED can be mounted on a base member 2b having a high thermal conductivity. The base member 2a can be screwed or otherwise joined to a front part 3a1 (lower part, in the diagram) of a generally L-shaped heat sink 3a which can be made of a high heat conductive material such as aluminum. The base member 2b can be screwed or otherwise joined to a front part 3b1 (lower part, in the diagram) of a generally L-shaped heat sink 3b which can be made of a high heat conductive material such as aluminum.

In the vehicle lamp of the present exemplary embodiment, as shown in FIG. 1A, the base members 2a and 2b can be interposed between the light emitting devices 1a and 1b and the front parts 3a1 and 3b1 of the heat sinks 3a and 3b, respectively. The presently disclosed subject matter is not limited thereto, however. Instead, the light emitting devices and the front parts of the respective heat sinks may be directly connected to each other.

In the vehicle lamp of the present exemplary embodiment, as shown in FIG. 1A, the base members 2a and 2b can be screwed to the front parts 3a1 and 3b1 of the heat sinks 3a and 3b, respectively. The presently disclosed subject matter is not limited thereto, however. Instead, the base members and the front parts of the respective heat sinks may be joined by using a heat conductive joining member such as a heat conductive tape, adhesives, or other attachment structure.

In the vehicle lamp of the present exemplary embodiment, as shown in FIGS. 1A and 2A, a rear part 3a2 (upper part, in the diagrams) of the generally L-shaped heat sink 3a and a rear part 3b2 (upper part, in the diagrams) of the generally L-shaped heat sink 3b can be screwed (see FIG. 2A) or otherwise joined to each other.

Put another way, the vehicle lamp according to the present exemplary embodiment can include a plurality of light emitting devices 1a and 1b and heat sinks 3a and 3b configured to dissipate heat generated by the plurality of light emitting devices 1a and 1b as shown in FIG. 1A. The front part 3a1 of the heat sink 3a and the front part 3b1 of the heat sink 3b can be branched so that the heat sinks 3a and 3b form a generally Y-shaped configuration in a horizontal cross-section that includes the primary optical axis CL of the vehicle lamp.

Consequently, in the vehicle lamp of the present exemplary embodiment, as shown in FIG. 1A, the heat generated by the light emitting device 1a can be dissipated by the front part 3a1 of the heat sink 3, not only from the side where the light emitting device 1a is connected (the left side, in the diagram; more specifically, the surface of the base member 2a) but also from the side where the light emitting device 1a is not connected (the right side, in the diagram).

The heat generated by the light emitting device 1b can be dissipated by the front part 3b1 of the heat sink 3, not only from the side where the light emitting device 1b is connected (the right side, in the diagram; more specifically, the surface of the base member 2b) but also from the side where the light emitting device 1b is not connected (the left side, in the diagram).

According to the vehicle lamp of the present exemplary embodiment, it is therefore possible to improve the efficiency of heat dissipation with respect to the heat generated by the plurality of light emitting devices 1a and 1b when compared with the conventional vehicle lamp where the heat sink (radiator plate) is formed in a generally I-shaped configuration when seen in a vertical plane that includes the primary optical axis of the vehicle lamp. That is, the vehicle lamp of the present exemplary embodiment can dissipate the heat generated by the plurality of light emitting devices 1a and 1b by means of the heat sinks 3a and 3b.

The vehicle lamp of the present exemplary embodiment can thus avoid a shortened life, dropped luminous intensity, and discolored light of the light emitting devices 1a and 1b, which might result from insufficient dissipation of the heat generated by the plurality of light emitting devices 1a and 1b.

In the vehicle lamp of the present exemplary embodiment, as shown in FIGS. 1A and 2A, the rear part 3a2 (upper part, in the diagrams) of the generally L-shaped heat sink 3a and the rear part 3b2 of the generally L-shaped heat sink 3b can be screwed to each other (see FIG. 2A). The presently disclosed subject matter is not limited thereto, however. Instead, the heat sinks may be joined to each other by using a heat conductive joining member such as a heat conductive tape or other attachment or adhesive structures.

In the vehicle lamp of the present exemplary embodiment, as shown in FIG. 1A, the front part 3a1 of the heat sink 3a and the front part 3b1 of the heat sink 3b can be branched so that the heat sinks 3a and 3b have a generally Y-shaped configuration as viewed in the horizontal section including the primary optical axis CL of the vehicle lamp. The presently disclosed subject matter is not limited thereto, however. Instead, the front part 3a1 of the heat sink 3a and the front part 3b1 of the heat sink 3b may be branched so that the heat sinks have a generally Y-shaped configuration in a vertical section that includes the primary optical axis CL of the vehicle lamp, or in an arbitrary cross section including the primary optical axis CL of the vehicle lamp other than the horizontal section or the vertical section.

In the vehicle lamp according to the present exemplary embodiment, as shown in FIG. 1A, the two generally L-shaped heat sinks 3a and 3b can be joined into the generally Y-shaped assembly of the heat sinks 3a and 3b. The presently disclosed subject matter is not limited thereto, however. Instead, a heat sink of generally Y-shaped configuration may be made of a single member that is so formed by molding, such as aluminum die-casting.

In the accompanying drawings, the reference numerals 3a2a and 3a2b designate areas where the rear part 3a2 of the heat sink 3a and a housing 6 are thermally connected with each other. The reference numerals 3b2a and 3b2b designate areas where the rear part 3b2 of the heat sink 3b and the housing 6 are thermally connected with each other. The reference numeral 4a designates a heat sink that is interposed between the rear part 3a2 of the heat sink 3a and a left part 5a of the flexible substrate 5. The reference numeral 4b designates a heat sink that is interposed between the rear part 3b2 of the heat sink 3b and a right part 5b of the flexible substrate 5. In the vehicle lamp of the present exemplary embodiment, the heat sinks 4a and 4b can be made of a high heat conductive material such as aluminum. The housing 6 can be made of a high heat conductive and high thermal dissipation material such as die-cast aluminum.

In the accompanying drawings, the reference numeral 5a1 designates a coupler that is mounted on the left part 5a of the flexible substrate 5 for the sake of supplying power to the light emitting device 1a. The reference numeral 5b1 designates a coupler that is mounted on the right part 5b of the flexible substrate 5 for the sake of supplying power to the light emitting device 1b. The reference numeral 5b2 designates a coupler that is mounted on the right part 5b of the flexible substrate 5 for the sake of connecting the flexible substrate 5 with an external power supply (not shown).

In the accompanying drawings, the reference numeral 8 designates an outer lens. The reference numeral 8a designates a plain lens area which constitutes a part of the outer lens 8. The reference numeral 8b designates a lens cut area which constitutes a part of the outer lens 8.

In the vehicle lamp according to the present exemplary embodiment, as typically shown in FIGS. 1B, 3A, and 3B, the reflector 7 can have a reflector part 7a configured to reflect the light emitted from the light emitting device 1a toward the front of the vehicle lamp (downward, in FIGS. 3A and 3B). As typically shown in FIGS. 1B, 4A, and 4B, the reflector 7 can also have a reflector part 7b configured to reflect the light emitted from the light emitting device 1b toward the front of the vehicle lamp (downward, in FIGS. 4A and 4B).

The reflector part 7a can have the reflecting surface 7a1 configured to reflect light beams that are emitted from the light emitting device 1a behind (above, in FIG. 3A) the primary optical axis CL1a of the light emitting device 1a with respect to the direction of the vehicle lamp. The reflector part 7a can also have the reflecting surface 7a2 configured to reflect light beams that are emitted from the light emitting device 1a in a frontward direction (below, in FIG. 3B) of the primary optical axis CL1a of the light emitting device 1a with respect to the direction of the vehicle lamp.

Furthermore, the reflector part 7b can have the reflecting surface 7b1 configured to reflect light beams that are emitted from the light emitting device 1b behind (above, in FIG. 4A) the primary optical axis CL1b of the light emitting device 1b with respect to the direction of the vehicle lamp. The reflector part 7b can also have the reflecting surface 7b2 configured to reflect light beams that are emitted from the light emitting device 1b in a frontward direction (below, in FIG. 4B) of the primary optical axis CL1b of the light emitting device 1b with respect to the direction of the vehicle lamp.

More specifically, in the vehicle lamp of the present exemplary embodiment, as shown in FIG. 3A, the light beams L1 and L2 reflected from the reflecting surface 7a1 can be projected forward (downward, in the diagram) of the vehicle lamp at relatively small angles, for example, at around 10° to the primary optical axis CL of the vehicle lamp (and an axis CL' parallel thereto). As shown in FIG. 3B, the light beam L3 reflected from the reflecting surface 7a2 can be projected to the front right (bottom right, in the diagram) of the vehicle lamp at relatively small angles, for example, at around 5° to the primary optical axis CL of the vehicle lamp. As shown in FIG. 3B, the light beam L4 reflected from the reflecting surface 7a2 can be refracted through the lens cuts 8b of the outer lens 8, and projected to the front right (lower right, in the diagram) of the vehicle lamp at relatively large angles, for example, at around 50° to the primary optical axis CL of the vehicle lamp. As shown in FIG. 3B, the light beam L5 reflected from the reflecting surface 7a2 can be refracted through the lens cuts 8b of the outer lens 8, and projected to the front right (lower right, in the diagram) of the vehicle lamp at relatively large angles, for example, at around 80° to the primary optical axis CL of the vehicle lamp. That is, the light beams L1 and L2 reflected from the reflecting surface 7a1 can be more condensed and brighter than the light beams L3, L4, and L5 reflected from the reflecting surface 7a2. In this exemplary embodiment, around 10° are exemplified as relatively small angles. In accordance with the presently disclosed subject matter, when the relatively small angles of approximately 20° or smaller can provide condensed beams of light, thereby reducing the size of the Y-shaped heat sink in the thickness direction.

Furthermore, in the vehicle lamp of the present exemplary embodiment, as shown in FIG. 4A, the light beams L6 and L7 reflected from the reflecting surface 7b1 can be projected forward (downward, in the diagram) of the vehicle lamp at relatively small angles, for example, at around 10° to the primary optical axis CL of the vehicle lamp (and the axis CL' parallel thereto). As shown in FIG. 4B, the light beam L8 reflected from the reflecting surface 7b2 can be projected to the front left (bottom left, in the diagram) of the vehicle lamp at relatively small angles, for example, at around 5° to the primary optical axis CL of the vehicle lamp. As shown in FIG. 4B, the light beam L9 reflected from the reflecting surface 7b2 can be refracted through the lens cuts 8b of the outer lens 8, and projected to the front left (lower left, in the diagram) of the vehicle lamp at relatively large angles, for example, at around 50° to the primary optical axis CL of the vehicle lamp. As shown in FIG. 4B, the light beam L10 reflected from the reflecting surface 7b2 can be refracted through the lens cuts 8b of the outer lens 8, and projected to the front left (lower left, in the diagram) of the vehicle lamp at relatively large angles, for example, at around 80° to the primary optical axis CL of the vehicle lamp. That is, the light beams L6 and L7 reflected from the reflecting surface 7b1 can be more condensed and brighter than the light beams L8, L9, and L10 that are reflected from the reflecting surface 7b2.

In the vehicle lamp of the present exemplary embodiment, as shown in FIG. 3B, the light beams L4 and L5 that are emitted from the light emitting device 1a in a frontward direction (below, in the diagram) of the vehicle lamp are reflected from the reflecting surface 7a2 of the reflector part 7a so as to be projected in front of the vehicle lamp at relatively large angles with respect to the primary optical axis CL of the vehicle lamp.

Consequently, according to the vehicle lamp of the present exemplary embodiment, as shown in FIG. 3B, the reflector part 7a can be reduced in size when compared with the case where the light beams L4 and L5 that are emitted from the light emitting device 1a in the frontward direction (below, in the diagram) of the vehicle lamp and are reflected from the reflecting surface 7a2 of the reflector part 7a so as to be projected in front of the vehicle lamp at relatively small angles with respect to the primary optical axis CL of the vehicle lamp.

In the vehicle lamp of the present exemplary embodiment, as shown in FIG. 4B, the light beams L9 and L10 that are emitted from the light emitting device 1b in the frontward direction (below, in the diagram) of the vehicle lamp are reflected from the reflecting surface 7b2 of the reflector part 7b so as to be projected in front of the vehicle lamp at relatively large angles with respect to the primary optical axis CL of the vehicle lamp.

Consequently, according to the vehicle lamp of the present exemplary embodiment, as shown in FIG. 4B, the reflector part 7b can be reduced in size when compared with the case where the light beams L9 and L10 that are emitted from the light emitting device 1b in the frontward direction (below, in the diagram) of the vehicle lamp are reflected from the reflecting surface 7b2' of the reflector part 7b so as to be projected in front of the vehicle lamp at relatively small angles with respect to the primary optical axis CL of the vehicle lamp.

As shown in FIGS. 3B and 4B, the vehicle lamp of the present exemplary embodiment can also be configured so that the light beams L4 and L5 reflected from the reflecting surface 7a2 and the light beams L9 and L10 reflected from the reflecting surface 7b2 cross each other near the primary optical axis CL of the vehicle lamp. The outer lens 8 can have a lens cut area 8b near the position where the light beams L4 and L5 reflected from the reflecting surface 7a2 and the light beams L9 and L10 reflected from the reflecting surface 7b2 cross each other.

More specifically, the lens cut area 8b formed on the outer lens 8 can diffuse the light beams L4 and L5 reflected from the reflecting surface 7a2. The lens cut area 8b can also diffuse the light beams L9 and L10 reflected from the reflecting surface 7b2.

According to the vehicle lamp of the present exemplary embodiment, the outer lens 8 can be reduced in size when compared with the case where a lens cut area 8b configured to diffuse the light beams L4 and L5 reflected from the reflecting surface 7a2 and a lens cut area 8b configured to diffuse the light beams L9 and L10 reflected from the reflecting surface 7b2 are provided separately from the outer lens 8. This also allows the miniaturization of the entire vehicle lamp.

In the vehicle lamp of the present exemplary embodiment, as shown in FIG. 1A, the lens cut area 8b can be arranged in front (under, in the diagram) of the heat sinks 3a and 3b, or more specifically, in front of the branched front parts 3a1 and 3b1 of the heat sinks 3a and 3b. As shown in FIG. 1B, the outlines 3a1' and 3b1' of the branched front parts 3a1 and 3b1 of the heat sinks 3a and 3b and the outline 8b' of the lens cut area 8b can be generally consistent with each other when seen from the front of the vehicle lamp. The outlines can be defined by an outer periphery of each of the devices as viewed from a front of the lamp along the optical axis.

According to the vehicle lamp of the present exemplary embodiment, the lens cut area 8b can thus prevent the heat sinks 3a and 3b, or the branched front part 3a1 of the heat sink 3a and the branched front part 3b1 of the heat sink 3b in particular, from being visible from the front of the vehicle lamp.

That is, the lens cut area 8b configured to diffuse the light beams L4 and L5 reflected from the reflecting surface 7a2 and the light beams L9 and L10 reflected from the reflected surface 7b2 can be used as a means for preventing the heat sinks 3a and 3b, or the branched front part 3a1 of the heat sink 3a and the branched front part 3b1 of the heat sink 3b, from being visible from the front of the vehicle lamp.

Thus, it is possible to suppress the cost of the entire vehicle lamp when compared with the case where a means for preventing the heat sinks 3a and 3b, or the branched front parts 3a1 and 3b1 of the heat sinks 3a and 3b, from being visible from the front of the vehicle lamp is provided separately from the lens cut area 8b configured to diffuse the light beams L4 and L5 reflected from the reflecting surface 7a2 and the light beams L9 and L10 reflected from the reflected surface 7b2.

As shown in FIG. 1A, the flexible substrate 5 configured to supply power to the light emitting devices 1a and 1b can be connected with the left side (left side, in the diagram) and right side (right side, in the diagram) of the unbranched rear parts 3a2 and 3b2 of the heat sinks 3a and 3b, respectively.

In the vehicle lamp of the present exemplary embodiment, as shown in FIGS. 1A and 2A, the unbranched rear part 3a2 of the heat sink 3a can be put into contact and thermally connected with the housing 6 at the end area 3a2a (top end, in the diagrams) opposite from the branched front part 3a1 of the heat sink 3a. An area 3a2b lying on the border between the branched front part 3a1 of the heat sink 3a and the unbranched rear part 3a2 of the heat sink 3a can also be put into contact and thermally connected with the housing 6.

More specifically, the left part 5a of the flexible substrate 5 can be connected with the left side (left side, in the diagrams) of the unbranched rear part 3a2 of the heat sink 3a. Some of the heat generated by components on this left part 5a can then be transferred to the housing 6 through the rear end area 3a2a (top end, in the diagrams) of the rear part 3a2 of the heat sink 3a, and dissipated from the housing 6.

In the vehicle lamp of the present exemplary embodiment, as shown in FIGS. 1A and 2A, some of the heat generated by the components on the left part 5a of the flexible substrate 5, in connection with the left side (left side, in the diagrams) of the unbranched rear part 3a2 of the heat sink 3a, can also be transferred to the housing 6 through the area 3a2b lying on the border between the front part 3a1 and the rear part 3a2 of the heat sink 3a, and dissipated from the housing 6.

That is, the heat generated by the components on the left part 5a of the flexible substrate 5 in connection with the left side (left side, in the diagram) of the unbranched rear part 3a2 of the heat sink 3a is prevented from being transferred to the front part 3a1 of the heat sink 3a where the light emitting device 1a is connected.

The vehicle lamp of the present exemplary embodiment can thus prevent a drop in the efficiency of heat dissipation for the light emitting device 1a, which might result if the heat generated by the components on the left part 5a of the flexible substrate 5 is transferred to the branched front part 3a1 of the heat sink 3a where the light emitting device 1a is connected.

In other words, in the vehicle lamp of the present exemplary embodiment, heat dissipation channels can be provided for the heat that is generated by the components on the left part 5a of the flexible substrate 5. Thus, the heat generated by the components on the left part 5a of the flexible substrate 5 is dissipated without reaching the light emitting device 1a.

The vehicle lamp of the present exemplary embodiment can thus improve the efficiency of heat radiation for the light emitting device 1a when compared with the case where sufficient heat dissipation channels are not provided for the heat that is generated by the components on the left part 5a of the flexible substrate 5.

Furthermore, in the vehicle lamp of the present exemplary embodiment, as shown in FIGS. 1A and 2A, the unbranched rear part 3b2 of the heat sink 3b can be put into contact and thermally connected with the housing 6 at the end area 3b2a (top end, in the diagrams) opposite from the branched front part 3b1 of the heat sink 3b. An area 3b2b lying on the border between the branched front part 3b1 of the heat sink 3b and the unbranched rear part 3b2 of the heat sink 3b can also be put into contact and thermally connected with the housing 6.

More specifically, the right part 5b of the flexible substrate 5 can be connected with the right side (right side, in the diagrams) of the unbranched rear part 3b2 of the heat sink 3b. Some of the heat generated by components on this right part 5b can then be transferred to the housing 6 through the rear end area 3b2a (top end, in the diagrams) of the rear part 3b2 of the heat sink 3b, and dissipated from the housing 6.

In the vehicle lamp of the present exemplary embodiment, as shown in FIGS. 1A and 2A, some of the heat generated by the components on the right part 5b of the flexible substrate 5, in connection with the right side (right side, in the diagrams) of the unbranched rear part 3b2 of the heat sink 3b, can also be transferred to the housing 6 through the area 3b2b lying on the border between the front part 3b1 and the rear part 3b2 of the heat sink 3b, and dissipated from the housing 6.

That is, the heat generated by the components on the right part 5b of the flexible substrate 5 in connection with the right side (right side, in the diagram) of the unbranched rear part 3b2 of the heat sink 3b can be prevented from being transferred to the front part 3b1 of the heat sink 3b where the light emitting device 1a is connected.

The vehicle lamp of the present exemplary embodiment can thus prevent a drop in the efficiency of heat dissipation for the light emitting device 1a, which might result if the heat generated by the components on the right part 5b of the flexible substrate 5 is transferred to the branched front part 3b1 of the heat sink 3b where the light emitting device 1b is connected.

In other words, in the vehicle lamp of the present exemplary embodiment, heat dissipation channels can be provided for the heat that is generated by the components on the right part 5b of the flexible substrate 5 so that the heat generated by the components on the right part 5b of the flexible substrate 5 is dissipated without reaching the light emitting device 1b.

The vehicle lamp of the present exemplary embodiment can thus improve the efficiency of heat radiation for the light emitting device 1b when compared with the case where sufficient heat dissipation channels are not provided for the heat that is generated by the components on the right part 5b of the flexible substrate 5 that is configured to supply power to the light emitting device 1b.

In the vehicle lamp of the present exemplary embodiment, as shown in FIG. 1A, the heat sink 4a can be interposed between the rear part 3a2 of the heat sink 3a and the left part 5a of the flexible substrate 5. The heat sink 4b can be interposed between the rear part 3b2 of the heat sink 3b and the right part 5b of the flexible substrate 5. The presently disclosed subject matter is not limited thereto, however. Instead, the heat sink between the rear part of the heat sink and the left part (right part) of the flexible substrate may be omitted.

In the vehicle lamp of the present exemplary embodiment, as shown in FIGS. 1A, 2B, and 2C, the circuit substrate configured to supply power to the light emitting devices 1a and 1b can be made of the flexible substrate 5. The left part 5a of the flexible substrate 5 can be connected with the left side (left side in FIG. 1A) of the unbranched rear part 3a2 of the heat sink 3a. The right part 5b of the flexible substrate 5 can be connected with the right side (right side in FIG. 1A) of the unbranched rear part 3b2 of the heat sink 3b.

According to the vehicle lamp of the present exemplary embodiment, it is therefore possible to reduce the parts count of the entire vehicle lamp, and by extension the assembly cost of the entire vehicle lamp, when compared with the case where a rigid substrate is connected to the left side of the unbranched rear part 3a2 of the heat sink 3a, and another rigid substrate is connected to the right side of the unbranched rear part 3b2 of the heat sink 3b. More specifically, according to the vehicle lamp of the present exemplary embodiment, it is possible to reduce the number of substrates, as well as wiring, couplers, and the like for connecting one rigid substrate to the other rigid substrate. This allows the miniaturization of the entire vehicle lamp.

The vehicle lamp of the present exemplary embodiment can also improve the packaging density of the components on the circuit substrate when compared with the case where a rigid substrate is connected to the left side (left side, in FIG. 1A) of the unbranched rear part 3a2 of the heat sink 3a, and another rigid substrate is connected to the right side (right side, in FIG. 1A) of the unbranched rear part 3b2 of the heat sink 3b. More specifically, using the thin flexible substrate 5 with low thermal resistance, the vehicle lamp of the present exemplary embodiment can transfer the heat generated by the components on the flexible substrate 5 to the heat sinks 3a and 3b quickly. This can reduce the thermal load on the components, so that a plurality of components can be mounted on the flexible substrate 5 with an increased package density.

In the vehicle lamp of the present exemplary embodiment, the heat sink 4a can be joined to the left part 5a of the flexible substrate 5 in advance as shown in FIG. 2C before the left part 5a of the flexile substrate 5 is connected with the left side of the unbranched rear part 3a2 of the heat sink 3a as shown in FIG. 1A.

Furthermore, the heat sink 4b can be joined to the right part 5b of the flexible substrate 5 in advance as shown in FIG. 2C before the right part 5b of the flexible substrate 5 is connected with the right side of the unbranched rear part 3b2 of the heat sink 3b.

The heat sink 4a can also be joined to the left side of the unbranched rear part 3a2 of the heat sink 3a, whereby the left part 5a of the flexible substrate 5 is connected with the left side of the rear part 3a2 of the heat sink 3a.

Furthermore, the heat sink 4b can also be joined to the right side (right side in the drawing) of the unbranched rear part 3b2 of the heat sink 3b, whereby the right part 5b of the flexible substrate 5 is connected with the right side of the rear part 3b2 of the heat sink 3b.

The vehicle lamp of the presently disclosed subject matter thereby allows improved workability when assembling the flexible substrate 5 and the heat sinks 3a and 3b when compared with the case where the left part 5a of the flexible substrate 5 is directly joined to the left side of the rear part 3a2 of the heat sink 3a, and the right part 5b of the flexible substrate 5 is directly jointed to the right side of the rear part 3b2 of the heat sink 3b.

In the vehicle lamp of the present exemplary embodiment, the left side of the rear part 3a2 of the heat sink 3a and the heat sink 4a can be joined by a heat conductive joining member such as a heat conductive tape or other known connection structure. The heat sink 4a and the left part 5a of the flexible substrate 5 can be joined by a heat conductive joining member such as a heat conductive tape or other known connection structure. The right side of the rear part 3b2 of the heat sink 3b and the heat sink 4b can be joined by a heat conductive joining member such as a heat conductive tape or other known connection structure. The heat sink 4b and the right part 5b of the flexible substrate 5 can be joined by a heat conductive joining member such as a heat conductive tape or other known connection structure. The presently disclosed subject matter is not limited thereto, however. Instead, these portions may be joined by arbitrary other joining methods and structures.

The foregoing embodiments of the presently disclosed subject matter and modifications thereof may be combined as appropriate.

The vehicle lamp according to the presently disclosed subject matter may be applied, for example, to a headlamp, turn signal lamp, position lamp, daytime running lamp, high beam lamp, fog lamp, tail lamp, stop lamp, traffic lamp, spot lamp, etc.

It will be apparent to those skilled in the art that various modifications and variations can be made in the presently disclosed subject matter without departing from the spirit or scope of the invention. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A method for manufacturing a lamp, wherein the lamp is configured to emit light in a frontward direction along a primary optical axis of the lamp, comprising:

providing a plurality of light emitting devices including at least a first light emitting device and a second light emitting device;

providing a first heat sink configured to dissipate heat generated by the plurality of light emitting devices, the first heat sink having a first branched part and a second branched part forming a generally Y-shaped configuration as viewed in a section that includes the primary optical axis of the lamp, the first branched part being connected with at least the first light emitting device, the second branched part being connected with at least the second light emitting device;

providing a circuit substrate configured to supply power to the plurality of light emitting devices, the circuit substrate connected with the first heat sink at first and second sides of an unbranched part of the first heat sink, wherein an end of the unbranched part opposite from the first and second branched parts is thermally connected with a housing of the lamp, and a border area between the first and second branched parts and the unbranched part is thermally connected with the housing of the lamp;

joining a second heat sink to a half of the circuit substrate in advance and before the half of the circuit substrate is connected with the first side of the unbranched part of the first heat sink;

joining a third heat sink to an other half of the circuit substrate in advance and before the other half of the circuit substrate is connected with the second side of the unbranched part of the first heat sink;

joining the second heat sink to the first side of the unbranched part of the first heat sink, thereby connecting the half of the circuit substrate with the first side of the unbranched part of the first heat sink; and joining the third heat sink to the second side of the unbranched part of the first heat sink, thereby connecting the other half of the circuit substrate with the second side of the unbranched part of the first heat sink.

2. The method for manufacturing a lamp according to claim 1, wherein the circuit substrate configured to supply power to the plurality of light emitting devices is made of a flexible substrate.

3. The method for manufacturing a lamp according to claim 1, further comprising:

providing the lamp with a first reflector configured to reflect light emitted from the first light emitting device toward the frontward direction with respect to the primary optical axis of the lamp, the first reflector having a first reflecting surface configured to reflect a beam of light that is emitted from the first light emitting device in a direction that is rearward with respect to the primary optical axis of the lamp, and a second reflecting surface configured to reflect a beam of light that is emitted from the first light emitting device in the frontward direction with respect to the primary optical axis of the lamp, and a second reflector configured to reflect light emitted from the second light emitting device toward the frontward direction with respect to the primary optical axis of the lamp, the second reflector having a third reflecting surface configured to reflect a beam of light that is emitted from the second light emitting device in a direction that is rearward with respect to the primary optical axis of the lamp, and a fourth reflecting surface configured to reflect a beam of light that is emitted from the second light emitting device in the frontward direction with respect to the primary optical axis of the lamp, so that the beam of light reflected from the first reflecting surface and the beam of light reflected from the third reflecting surface are projected frontward with respect to the primary optical axis of the lamp and each at a relatively small angle with respect to the primary optical axis of the lamp, and the beam of light reflected from the second reflecting surface and the beam of light reflected from the fourth reflecting surface are projected frontward with respect to the primary optical axis of the lamp and each at a relatively larger angle with respect to the primary optical axis of the lamp as compared to each relatively small angle.

4. The method for manufacturing a lamp according to claim 2, further comprising:

providing the lamp with a first reflector configured to reflect light emitted from the first light emitting device toward the frontward direction with respect to the primary optical axis of the lamp, the first reflector having a first reflecting surface configured to reflect a beam of light that is emitted from the first light emitting device in a direction that is rearward with respect to the primary optical axis of the lamp, and a second reflecting surface configured to reflect a beam of light that is emitted from the first light emitting device in the frontward direction with respect to the primary optical axis of the lamp, and a second reflector configured to reflect light emitted from the second light emitting device toward the frontward direction with respect to the primary optical axis of the lamp, the second reflector having a third reflecting surface configured to reflect a beam of light that is emitted from the second light emitting device in a direction that is rearward with respect to the primary optical axis of the lamp, and a fourth reflecting surface configured to reflect a beam of light that is emitted from the second light emitting device in the frontward direction with respect to the primary optical axis of the lamp, so that the beam of light reflected from the first reflecting surface and the beam of light reflected from the third reflecting surface are projected frontward with respect to the primary optical axis of the lamp and each at a relatively small angle with respect to the primary optical axis of the lamp, and the beam of light reflected from the second reflecting surface and the beam of light reflected from the fourth reflecting surface are projected frontward with respect to the primary optical axis of the lamp and each at a relatively larger angle with respect to the primary optical axis of the lamp as compared to each relatively small angle.

5. The method for manufacturing a lamp according to claim 3, further comprising:

providing the lamp with an outer lens, wherein the first and second reflector are configured such that the beam of light reflected from the second reflecting surface and the beam of light reflected from the fourth reflecting surface cross each other substantially at the primary optical axis of the lamp, and the outer lens has a lens cut area substantially at a position where the beam of light reflected from the second reflecting surface and the beam of light reflected from the fourth reflecting surface cross each other.

6. The method for manufacturing a lamp according to claim 4, further comprising:

providing the lamp with an outer lens, so that the first and second reflector are configured such that the beam of light reflected from the second reflecting surface and the beam of light reflected from the fourth reflecting surface cross each other substantially at the primary optical axis of the lamp, and the outer lens has a lens cut area substantially at a position where the beam of light reflected from the second reflecting surface and the beam of light reflected from the fourth reflecting surface cross each other.

7. The method for manufacturing a lamp according to claim 5, wherein the lens cut area is arranged in front of the first and second branched parts of the first heat sink, and wherein outer perimeters of the first and second branched parts and an outer perimeter of the lens cut area are generally consistent with and substantially overlap each other when viewed from the front with respect to the primary optical axis of the lamp.

8. The method for manufacturing a lamp according to claim 6, wherein the lens cut area is arranged in front of the first and second branched parts of the first heat sink, and wherein outer perimeters of the first and second branched parts and an outer perimeter of the lens cut area are generally consistent with and substantially overlap each other when viewed from the front with respect to the primary optical axis of the lamp.

9. A method for manufacturing a lamp, wherein the lamp is configured to emit light in a frontward direction along a primary optical axis of the lamp, comprising:

providing a plurality of light emitting devices including at least a first light emitting device and a second light emitting device;

providing a first heat sink configured to dissipate heat generated by the plurality of light emitting devices, the first heat sink having a first branched part and a second branched part forming a generally Y-shaped configuration as viewed in a section that includes the primary optical axis of the lamp;

connecting the first branched part with at least the first light emitting device;

connecting the second branched part with at least the second light emitting device;

providing a first reflector configured to reflect light emitted from the first light emitting device toward the frontward direction with respect to the primary optical axis of the lamp, the first reflector having a first reflecting surface configured to reflect a beam of light that is emitted from the first light emitting device in a direction that is rearward with respect to the primary optical axis of the lamp, and a second reflecting surface configured to reflect a beam of light that is emitted from the first light emitting device in the frontward direction with respect to the primary optical axis of the lamp;

providing a second reflector configured to reflect light emitted from the second light emitting device toward the frontward direction with respect to the primary optical axis of the lamp, the second reflector having a third reflecting surface configured to reflect a beam of light that is emitted from the second light emitting device in a direction that is rearward with respect to the primary optical axis of the lamp, and a fourth reflecting surface configured to reflect a beam of light that is emitted from the second light emitting device in the frontward direction with respect to the primary optical axis of the lamp, and wherein the beam of light reflected from the first reflecting surface and the beam of light reflected from the third reflecting surface are projected frontward with respect to the primary optical axis of the lamp and each at a relatively small angle with respect to the primary optical axis of the lamp, and wherein the beam of light reflected from the second reflecting surface and the beam of light reflected from the fourth reflecting surface are projected frontward with respect to the primary optical axis of the lamp and each at a relatively larger angle with respect to the primary optical axis of the lamp as compared to each relatively small angle.

10. The method for manufacturing a lamp of claim 9, further comprising:

providing an outer lens, and configuring the first and second reflector such that the beam of light reflected from the second reflecting surface and the beam of light reflected from the fourth reflecting surface cross each other substantially at the primary optical axis of the lamp, wherein the outer lens has a lens cut area substantially at a position where the beam of light reflected from the second reflecting surface and the beam of light reflected from the fourth reflecting surface cross each other.

11. The method for manufacturing a lamp of claim 10, further comprising:

providing the lens cut area in front of the first and second branched parts of the first heat sink, and wherein outer perimeters of the first and second branched parts and an outer perimeter of the lens cut area are generally consistent with and substantially overlap each other when viewed from the front with respect to the primary optical axis of the lamp.

12. The method for manufacturing a lamp according to claim 9, further comprising:

providing a circuit substrate configured to supply power to the plurality of light emitting devices, the circuit substrate connected with the first heat sink at first and second sides of an unbranched part of the first heat sink, thermally connecting an end of the unbranched part opposite from the first and second branched parts with a housing of the lamp, and thermally connecting a border area between the first and second branched parts and the unbranched part with the housing of the lamp.

13. The method for manufacturing a lamp according to claim 12, further comprising:

configuring the circuit substrate from a flexible substrate;

connecting a half of the flexible substrate with the first side of the unbranched part of the first heat sink, and an other half of the flexible substrate with the second side of the unbranched part of the first heat sink.

* * * * *